United States Patent [19]

Meinel

[11] Patent Number: 4,780,795
[45] Date of Patent: Oct. 25, 1988

[54] PACKAGES FOR HYBRID INTEGRATED CIRCUIT HIGH VOLTAGE ISOLATION AMPLIFIERS AND METHOD OF MANUFACTURE

[75] Inventor: Walter B. Meinel, Tucson, Ariz.

[73] Assignee: Burr-Brown Corporation, Tucson, Ariz.

[21] Appl. No.: 122,595

[22] Filed: Nov. 17, 1987

Related U.S. Application Data

[63] Continuation of Ser. No. 856,720, Apr. 28, 1986, abandoned.

[51] Int. Cl.$^4$ ............................................. H05K 1/16
[52] U.S. Cl. .............................. 361/402; 174/52 FP; 174/52 PE; 357/80; 361/323; 361/328; 361/406
[58] Field of Search ............. 174/52 FP, 52 PE; 361/328, 329, 397, 402, 403, 406, 323, 433 W; 357/80

[56] References Cited

U.S. PATENT DOCUMENTS

| | | | |
|---|---|---|---|
| 2,600,343 | 6/1952 | Tuttle | 361/397 X |
| 2,777,110 | 1/1957 | Kodama | 323/74 |
| 2,885,601 | 5/1959 | Pessel | 361/397 X |
| 2,896,028 | 7/1959 | Mackey | 336/200 X |
| 3,104,377 | 9/1963 | Alexander et al. | 340/173.2 |
| 3,316,458 | 4/1967 | Jenny | 174/52 FE |
| 3,489,952 | 1/1970 | Hinchey | 174/52 PE |
| 3,614,832 | 10/1971 | Chance et al. | 29/626 |
| 3,675,095 | 7/1972 | Lehmann | 317/261 |
| 3,679,941 | 7/1972 | Lacombe et al. | 361/406 |
| 3,745,508 | 7/1973 | Bruder et al. | 336/200 X |
| 3,757,175 | 9/1973 | Kim et al. | 357/80 |
| 3,764,938 | 10/1973 | Barnes | 331/96 |
| 3,833,838 | 9/1974 | Christiansen | 336/200 X |
| 4,038,488 | 7/1977 | Lin | 174/52 |
| 4,143,508 | 3/1979 | Ohno | 58/23 |
| 4,167,647 | 9/1979 | Salera | 174/52 |
| 4,173,033 | 10/1979 | Sako et al. | 361/323 |
| 4,188,651 | 2/1980 | Dornfeld et al. | 361/322 |
| 4,376,274 | 3/1983 | Smart | 336/200 X |
| 4,506,108 | 3/1985 | Kersch et al. | 174/52 |
| 4,536,638 | 8/1985 | Krynicki | 219/121 |
| 4,551,747 | 11/1985 | Gilbert et al. | 361/414 X |
| 4,561,039 | 12/1985 | Tsukahara | 361/328 |
| 4,705,917 | 11/1987 | Gates et al. | 174/52 FP |

FOREIGN PATENT DOCUMENTS

1197561 7/1965 Fed. Rep. of Germany .
2723363 11/1978 Fed. Rep. of Germany .
1469944 4/1977 United Kingdom .

Primary Examiner—R. R. Kucia
Attorney, Agent, or Firm—Cahill, Sutton & Thomas

[57] ABSTRACT

A dual cavity semiconductor package containing a high voltage (greater than 1500 volts) isolation amplifier includes a ceramic substrate with tungsten metalization thereon defining die bonding and wire bonding sites and interconnections in the two cavities for input and output circuitry of the isolation amplifier, respectively. The metalization also defines a pair of precisely matched planar fringe capacitors forming a high voltage small signal isolation barrier located between the two cavities. A layer of ceramic having apertures therein defining the two cavities is laminated over the substrate. The assembly is cofired at about 2,000° Centigrade, causing the ceramic to fill the gaps between the conductors of the fringe capacitors, providing very high voltage isolation therebetween. Separate tungsten sealing rings are provided around the peripheries of the cavities on the top surface of the second layer. In another embodiment of the invention, a single large cavity has spaced separate regions for input and output circuitry of the isolation amplifier.

19 Claims, 5 Drawing Sheets

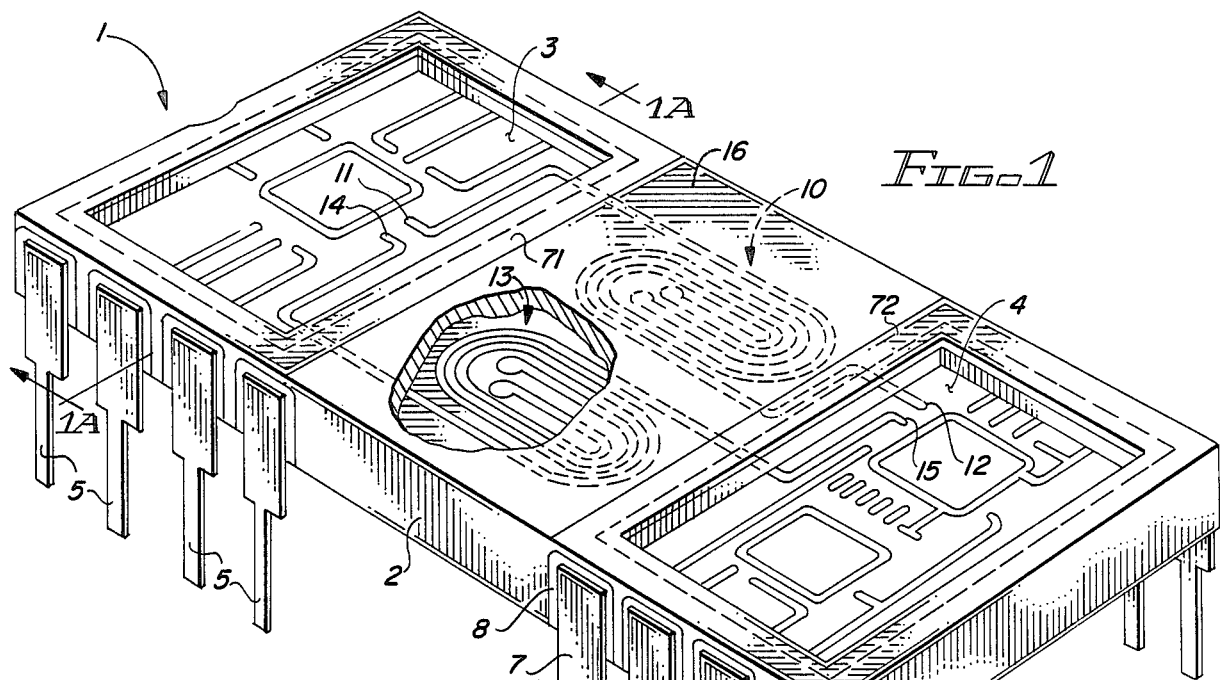
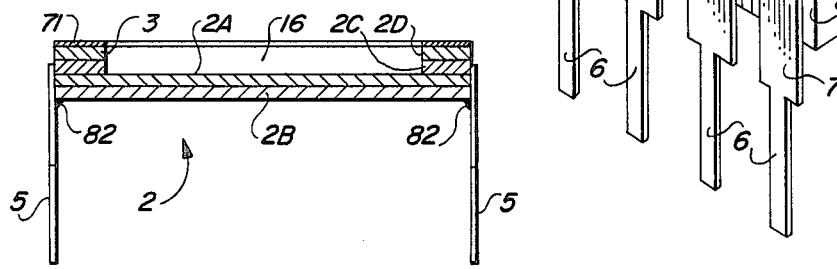
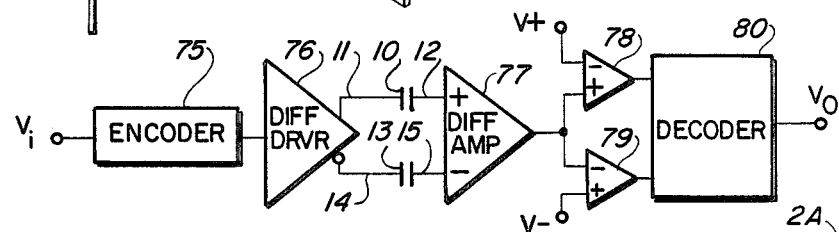
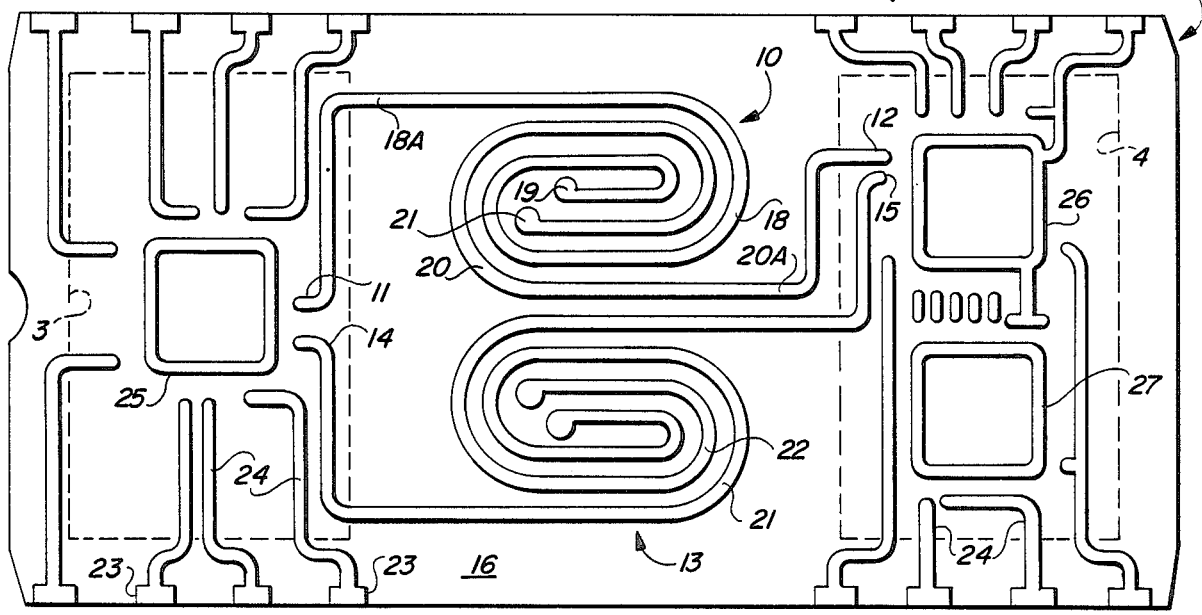

PACKAGES FOR HYBRID INTEGRATED CIRCUIT HIGH VOLTAGE ISOLATION AMPLIFIERS AND METHOD OF MANUFACTURE

CROSS-REFERENCE TO RELATED APPLICATION

This is a continuation of Ser. No. 856,720, Apr. 28, 1986 now abandoned.

This invention is related to copending patent application entitled "ISOLATION AMPLIFIER WITH PRECISION TIMING OF SIGNALS COUPLED ACROSS ISOLATION BARRIER", by Thomas Somerville, now U.S. Pat. No. 4,748,419 issued May 31, 1988 filed on even date herewith and incorporated herein by reference.

BACKGROUND OF THE INVENTION

The invention relates to high voltage semiconductor packages, and particularly to ones especially suited for containing high voltage isolation amplifiers, and more particularly to such packages utilizing fringe capacitors as small signal isolation barriers between input and output portions of isolation amplifiers.

There are many applications for a type of amplifier circuit referred to by those skilled in the art as an "isolation amplifier". Isolation amplifier circuits have electrically isolated input and output stages that are separated by "isolation barriers" that can withstand voltage differences of at least hundreds of volts, and in some cases thousands of volts, and are capable of amplifying small AC input signals to produce larger AC output signals despite the large DC or common mode voltage difference between the input and output terminals. Typical applications for isolation amplifiers include industrial measurement systems, medical electronic equipment, electronic test equipment, and numerous other applications where highly isolated signal transmission is needed. Isolation amplifiers are generally considered to be expensive components. The extent of utilization of isolation amplifiers in the electronics industry would be much greater if lower cost devices of this type could be manufactured. Up to now, however, no one has been able to make a highly accurate, high voltage isolation amplifier, especially one that is hermetically sealed, inexpensively enough to "open up the market" for widespread use of such devices in low cost electronics products.

In the past, most isolation amplifiers either have utilized toroidal transformers as isolation barriers, or else have used optoelectronic devices as isolation barriers. Optoelectronic devices at the present state of the art are too expensive or too slow for many applications, although they offer a high degree of electrical isolation between the input and output stages thereof. Isolation amplifiers utilizing ferrite toroid transformers as isolation barriers are large in size, and are difficult to integrate into hybiid integrated circuit packages, and are very expensive. No hermetically sealed hybrid integrated circuit isolation amplifiers of this type are yet commercially available.

One patent, commonly assigned U.S. Pat. No. 4,292,595 (Smith) introduces the concept of using capacitors as isolation barriers for high voltage isolation amplifiers. The technique described requires use of large (50 picofarad) capacitors which would occupy a large amount of area on a hybrid integrated circuit substrate, and is impractical.

Prior isolation amplifiers utilizing separate toroidal transformers for coupling small AC signals across an isolation barrier and simultaneously coupling large high power DC signals across an isolation barrier between the same input and output stages are known. Such circuits are expensive.

Fringe capacitors have been described in the prior art. For example, U.S. Pat. Nos. 4,188,651 (Dornfeld, et al.), 3,764,938 (Barnes), 3,675,095 (Lehmann), and 3,104,377 (Alexander et al.) disclose interdigitated coplanar capacitor structures. None of these, however, is disclosed as a high voltage component, nor would any of them be useful in a high voltage (i.e., greater than 1500 volts) isolation barrier structure for an isolation amplifier). Furthermore, none would be compatible with conventional hybrid integrated circuit manufacturing processes.

A variety of multiple cavity integrated circuit packages are known in the art, for example as shown in U.S. Pat. No. 4,038,488 (Lin). The structure disclosed in this reference is not useful for isolation amplifiers, because there is no isolation barrier between the two cavities. The stated purpose of the structure is to avoid any electrical coupling between the two cavities.

SUMMARY OF THE INVENTION

Accordingly, it is an object of the invention to provide an improved low cost semiconductor package for high voltage isolation amplifiers, utilizing coplanar fringe capacitors as isolation barriers.

It is another object of the invention to provide a hermetically sealed semiconductor package for a low cost high voltage isolation amplifier.

It is another object of the invention to provide a low cost high voltage isolation amplifier utilizing manufacturing processes that are compatible with conventional hybrid integrated circuit manufacturing processes.

It is another object of the invention to provide an improved semiconductor package structure including a high voltage, small signal capacitive isolation barrier and a high power isolation barrier within the same circuit.

Briefly described, and in accordance with one embodiment thereof, the invention provides a hybrid integrated circuit package structure including a planar capacitor on a insulative substrate including first and second metal film conductors on the substrate and having precisely spaced parallel portions with capacitive coupling therebetween, a dielectric layer on the parallel portions and between the separate sections of the parallel portions, with exposed portions of the first and second metal film conductors extending beyond the dielectric layer and forming first and second terminals of the planar capacitor. In one described embodiment of the invention, the first and second metal film conductors are of refractory metal, the substrate is ceramic, and the dielectric layer includes a ceramic layer cofired with the substrate so that ceramic material fills space between the first and second metal film conductors, preventing arcing at high voltages between the terminals of the capacitor. The ceramic layer includes first and second openings defining first and second cavities in which input circuitry and output circuitry of a high voltage isolation amplifier are disposed. The first and second cavities are disposed on opposite sides of the capacitor, which form an isolation barrier of the isolation amplifier. A second matched capacitor is formed along with the first one. Terminals of both capacitors extend into the first and second cavities and are electrically connected to the input stage and output stage of the isolation amplifier, respectively. End portions of the first and second metal film conductors of each capacitor define a pair of generally spiral traces, the ends of which are rounded to reduce electric fields thereat and thereby prevent electrical arcing. In another embodiment of the invention, the first and second capacitors forming the isolation barrier for the isolation amplifier are parallel plate capacitors. In another embodiment of the invention, the input stage and the output stage of the isolation amplifier are disposed within a single large cavity, with a square toroid transformer disposed in the cavity between the first and second regions. The square toroid includes a plurality of primary windings, the bottom portion of each primary winding being formed by a strip of metalization on a ceramic substrate, the remaining portion of each winding being formed by a wire bonding conductor looping over the toroid and wire bonded to opposite ends of adjacent metalization strips, to thereby form a continuous primary winding. The secondary winding of the transformer is formed in the same manner about a parallel opposite leg of the square toroid. Within the center of the square toroid, a pair of coplanar fringe capacitors are formed, beneath an insulative layer. The structure allows coupling of small AC signals across the fringe capacitor isolation barrier and high power DC signals across the toroidal transformer. The square toroid structure provides a large number of primary windings and a large number of secondary windings, all of which are spaced sufficiently far apart to prevent electrical arcing between the primary and secondary windings and thereby provide very large isolation voltages and high winding inductances leading to lower cost driver circuits therefor. In another embodiment of the invention, a lead frame is provided with separate sections for supporting the input circuitry of the isolation amplifier and the output circuitry of the isolation amplifier. A substrate having a pair of matched fringe capacitors thereon is suspended between the two sections of the lead frame. After wire bonding of terminals of the fringe capacitors to the appropriate input and output circuits, the circuitry and supporting portions of the lead frame are encapsulated in plastic.

BRIEF DESCRIPTION OF THE DRAWINGS

FIG. 1 is a perspective view of an isolation amplifier package of the present invention.

FIG. 1A is a section view taken along section line 1—1 of FIG. 1.

FIG. 2 is a top partial cutaway view of the package of FIG. 1.

FIG. 6 is a block diagram of the isolation amplifier contained in the high voltage package of FIG. 1.

DESCRIPTION OF THE INVENTION

Figure 3:
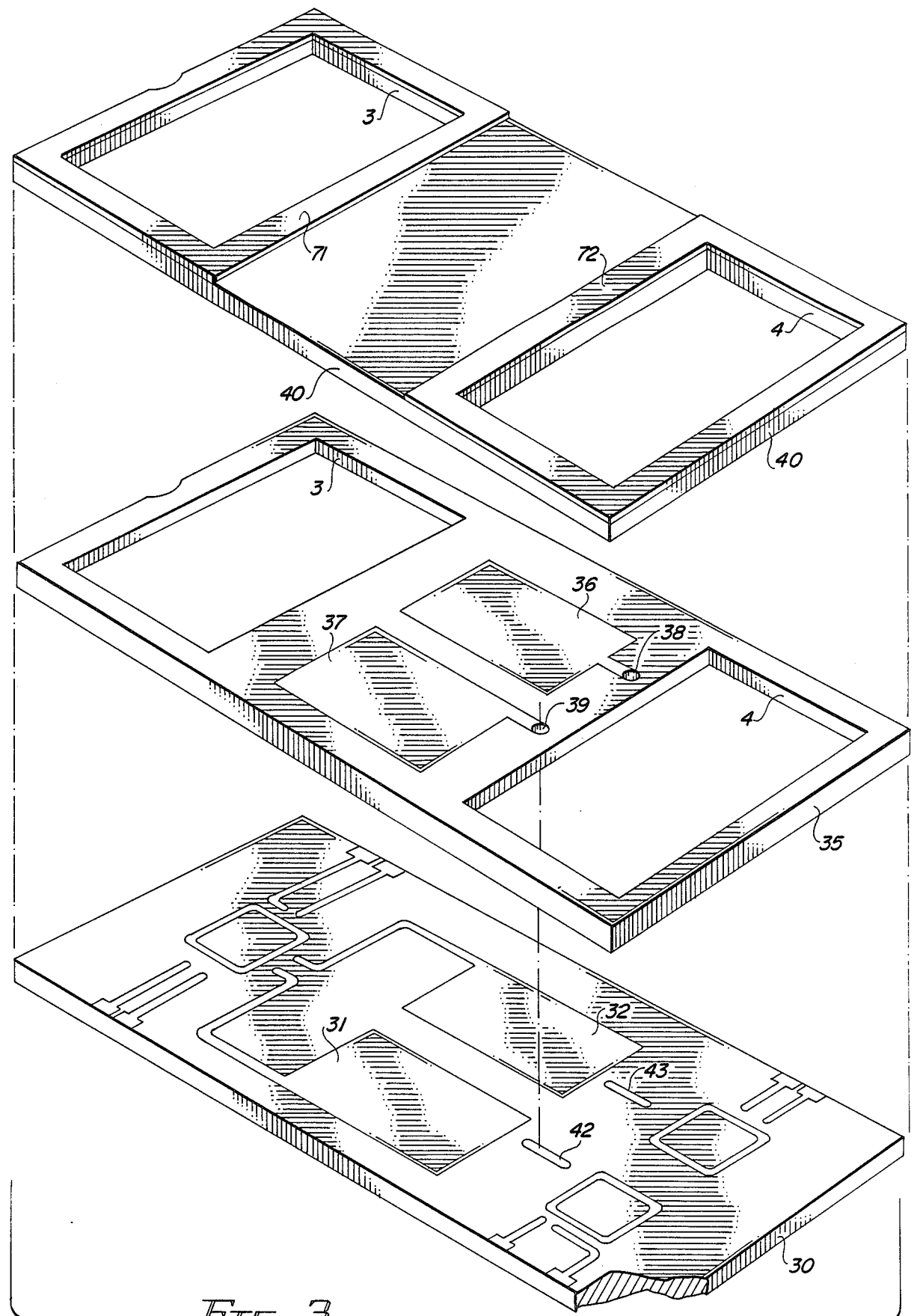
FIG. 3 is a perspective exploded view of an alternate isolation amplifier package of the present invention.

Referring now to the drawings, particularly FIGS. 1 and 2, isolation amplifier package 1 includes a ceramic body 2 having a first cavity 3 and a second cavity 4 therein at opposite ends thereof. An intermediate region 16 of body 2 separates cavities 3 and 4.

Body 2 is composed of a laminated structure as best shown in FIG. 1A. More specifically, body 2 includes four laminated layers of alumina designated by reference numerals 2A, 2B, 2C, and 2D. Openings in the upper two layers 2C and 2D define the cavities 3 and 4. First and second fringe capacitors 10 and 13 are sandwiched between the intermediate portion of layers 2A and 2C.

An encoder 75 (see FIG. 6) and a differential driver circuit 76 having an input connected to the output of encoder 75, all shown in FIG. 6, are located in cavity 3. One output of the differential driver 76 is connected to a terminal 11 of fringe capacitor 10. A complementary output of differential driver 76 is connected to a terminal 14 of fringe capacitor 13. A second terminal 12 of fringe capacitor 10 is connected to the positive input of differential amplifier 77. The second terminal of fringe capacitor 13 has a terminal 15 connected to the negative input of differential amplifier 77. Differential amplifier 77, two comparators 78 and 79, and a decoder 80 are disposed in second cavity 4. The detailed structure and detailed operation of the circuitry shown in FIG. 6 are described in the above-mentioned Sommerville application.

The configuration of fringe capacitor 10 is best shown in FIG. 2. Fringe capacitor 10 includes two generally elongated, spiral, equally spaced metal conductors 18 and 20. Each is disposed on the upper surface of alumina layer 2A, sandwiched between that layer and intermediate portions 16 of alumina layer 2C. Conductor 18 has a portion 18A that is covered by portion 16 of layer 2C, and a portion that extends beyond section 16 into cavity 3 to form terminal 11 of fringe capacitor 10. Conductor 18 also has an enlarged circular end portion 19 to reduce the electric field thereat.

Fringe capacitor 10 also includes a second elongated conductor 20 having a portion that is parallel to conductor 18. Conductor 20 has an enlarged circular end portion 21, which also is rounded to reduce the electric field thereat. A portion 20A of conductor 20 extends under portion 16 of layer 2C into cavity 4 to form terminal 12 of fringe capacitor 10.

Similarly, the second fringe capacitor 13 has first and second coplanar metal conductors 21 and 22, each having parallel portions, and each terminating in an enlarged circular end portion to reduce the electric fields thereat. Conductor 21 extends under portion 16 of layer 2A into cavity 3 to form terminal 14. Conductor 22 extends into cavity 4 to form terminal 15 of fringe capacitor 13.

A number of other metal conductors are formed on the upper surface of ceramic layer 2A, as is conventional in hybrid integrated circuits, to provide interconnection between various chips therein. For example, conductors 24 form conductive runs to package leads such as 5 (FIG. 1) that are brazed to the side of the ceramic body 2. Square rings 25, 26, and 27 are sites for bonding three integrated circuit die to the surface of ceramic layer 2A. Edge conductors such as 23 facilitate electrical connection to the leads 5.

The method of making the isolation amplifier integrated circuit shown in FIGS. 1, 1A, 2, and 6 is to print the tungsten metalization pattern shown in FIG. 2 on the upper surface of alumina layer 2A. Also, two cover seal rings 71 and 72 as shown in FIG. 1 are formed on top of alumina layer 2D, after cavity openings 3 and 4 have been punched out of layers 2C and 2D. After the metalization has been screened onto layers 2A and 2D, the four layers 2A-2D are pressed together.

The metalization is formed of tungsten or other high temperature refractory metal. As a practical matter, the ceramic layers are only approximately 20 mils thick, so the depth of the cavities 3 and 4 (each defined by two of the ceramic layers 2C and 2D, each of which are approximately 20 mils thick) is approximately 40 mils.

After the four layers, with tungsten metalization screened thereon, are aligned and pressed together, they are "cofired" at approximately 2,000° Centigrade in accordance with processes known to those skilled in the art.

The tungsten metalization is nickel plated, using an electroless metal plating process that is well known and therefore not described in detail. Nickel plating also is provided on the edges of ceramic body 2 in the rectangular areas designated by reference numeral 8 in FIG. 1, to allow subsequent brazing of leads 5 thereto.

The next step in the procedure is to align leads 5, which are connected to suitable lead frames, to the nickel attachment regions 8. Note that each lead frame includes two groups of leads aligned with cavities 3 and 4, but no leads attached to the intermediate region 16. This spacing is necessary to prevent electrical arcing between the input stage including encoder 75 and differential driver 76 and the output stage including differential amplifier 77, comparator 78 and 79, and decoder 80.

The next step in the manufacturing process is to braze the enlarged heads 7 of leads 5 to the nickel plated attachment regions 8 on the opposed sides of ceramic body 2. Reference numerals 82 in FIG. 1A indicate brazed points.

The next step is to gold plate all of the exposed nickel and lead metalization. Gold plating steps, one electrolytic and one electroless, are required if there are any metalization regions within either cavity that are not connected to one of the two lead frames. Both electrolytic and electroless gold plating procedures are well known to those skilled in the art, and are not described in detail. However, electrolytic gold plating is superior and is used to plate as much of the metalization as possible.

Once all of the exposed metalization in cavities 3 and 4 is plated, the various monolithic integrated circuit chips including the components shown in FIG. 6 are die bonded to the die bonding areas 25, 26, and 27 (FIG. 2). After die bonding has been completed, then the bonding pads of the integrated circuit chip are wire bonded to the inner ends of the various metalization conductors 24 in cavities 3 and 4.

Next, metal covers are attached to the seal rings 71 and 72 utilizing annular solder preforms. This is a conventional step which need not be described in detail.

The widths of the metalization lines shown in FIG. 2 can be 10 mils. The separation or spacing between the conductors forming fringe capacitor 10 can be 20 mils if isolation of about 1500 volts is desired between the input and output stage of the isolation amplifier. If isolation greater than about 3500 volts is needed, then the spacing between conductors 18 and 20 should be about 25 mils.

The length of the substrate 16 in FIG. 2 is 1.2 inches in the present embodiment of the invention, and its width is 0.6 inches. The width of the central portion between cavities 3 and 4 is 0.38 inches.

The thickness of the nickel plating typically is 50 microinches, and the thickness of the gold plating thereon is typically about 30 microinches. Typically, gold/tin solder rings are used to hermetically seal metal lids to the sealing rings 71 and 72. The above-described structure has the advantage that the isolation barrier fringe capacitors 10 and 13 can be formed during the same screening step in which the other metalization runs are formed. The only difference between the process for making the above-described package is in the configuration of the patterns of the various metalization and the patterns of the holes punched to define the cavities, so no additional process steps are required. Although the fringe capacitors require more substrate area than parallel plate capacitors of the same capacitance, the desirability of separating the two cavities 3 and 4 in the ceramic body provides substrate area that would not be effectively used anyway.

The capacitance of the fringe capacitors, with 20 mil spacing therebetween, is approximately 3 picofarads per inch. As explained in the copending Sommerville application, accurate performance for the isolation amplifier circuitry disclosed therein is obtained with only approximately 3 picofarads of capacitance for isolation barrier fringe capacitors 10 and 13. The two fringe capacitors are precisely matched, even though their absolute value can vary by about ±20%.

The above-described invention provides an hybrid-IC-process-compatible, low cost, high voltage isolation amplifier in a hermetically sealed package structure. Up to now, such a product has not been supplied to the market by any manufacturer.

Although the above-described dual cavity, fringe capacitor isolation barrier structure is a presently preferred embodiment of the invention, it would be possible to use parallel plate capacitors instead of coplanar fringe capacitors, as shown in FIG. 3.

In FIG. 3, three ceramic layers 30, 35, and 40 are cofired, after screening the illustrated tungsten patterns thereon and cutting the indicated openings 3 and 4 in ceramic layers 35 and 40. More specifically, reference numerals 31 and 32 designate the tungsten lower plate of the two isolation barrier capacitors 10 and 13 (FIG. 6), respectively. The thin extensions extend into the cavity 3.

Openings 3 and 4 in the middle ceramic layer 35 define the above-mentioned cavities 3 and 4. Tungsten metalization layers 36 and 37 define the upper plates of the two isolation barrier capacitors and the right-hand extensions to feedthrough holes 38 and 39, respectively, in which tungsten feedthroughs are provided to make connection to points 43 and 42, respectively, on ceramic substrate 30. The top ceramic layer 40 has two openings 3 and 4 therein defining cavities 3 and 4. Tungsten sealing rings 71 and 72 are screened on the top of ceramic layer 40, as previously mentioned with reference to FIG. 1. During the tungsten "ink" screening process, feedthrough holes 38 and 39 fill up with tungsten, providing electrical feedthroughs that become electrically continuous with upper capacitive plates 36 and 37 and lower conductors 42 and 43. The assembly is cofired at about 2,000° Centigrade. Subsequent steps are precisely as described above for the embodiment of FIG. 1.

This embodiment of the invention will be useful if higher values of isolation barrier capacitors 10 and 13 are required than can be accomplished by using fringe capacitors of FIG. 1.

Figure 4:
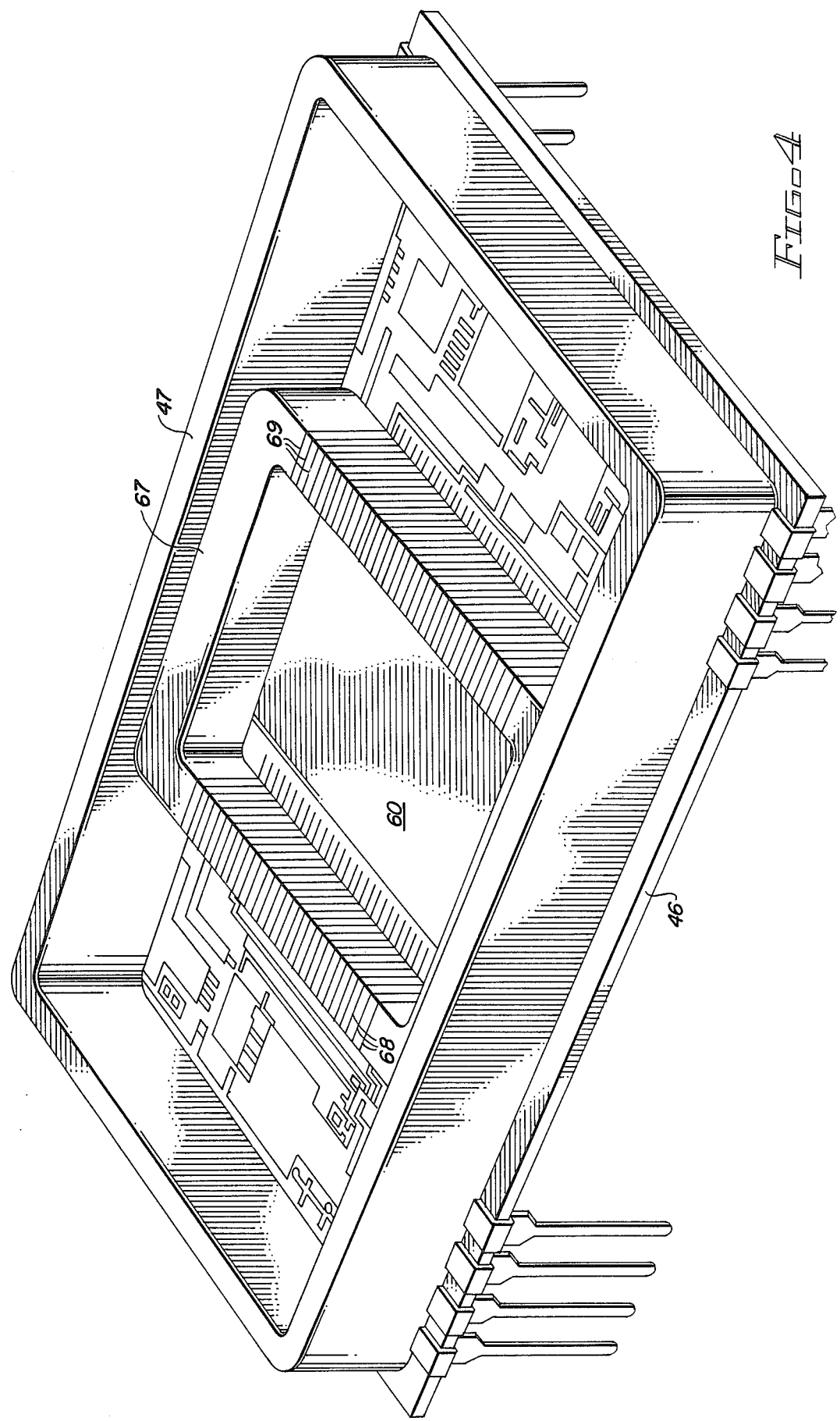
FIG. 4 is a perspective view of a single cavity isolation amplifier package including a square toroid transformer isolation barrier and a coplanar fringe capacitor isolation barrier.
Figure 5:
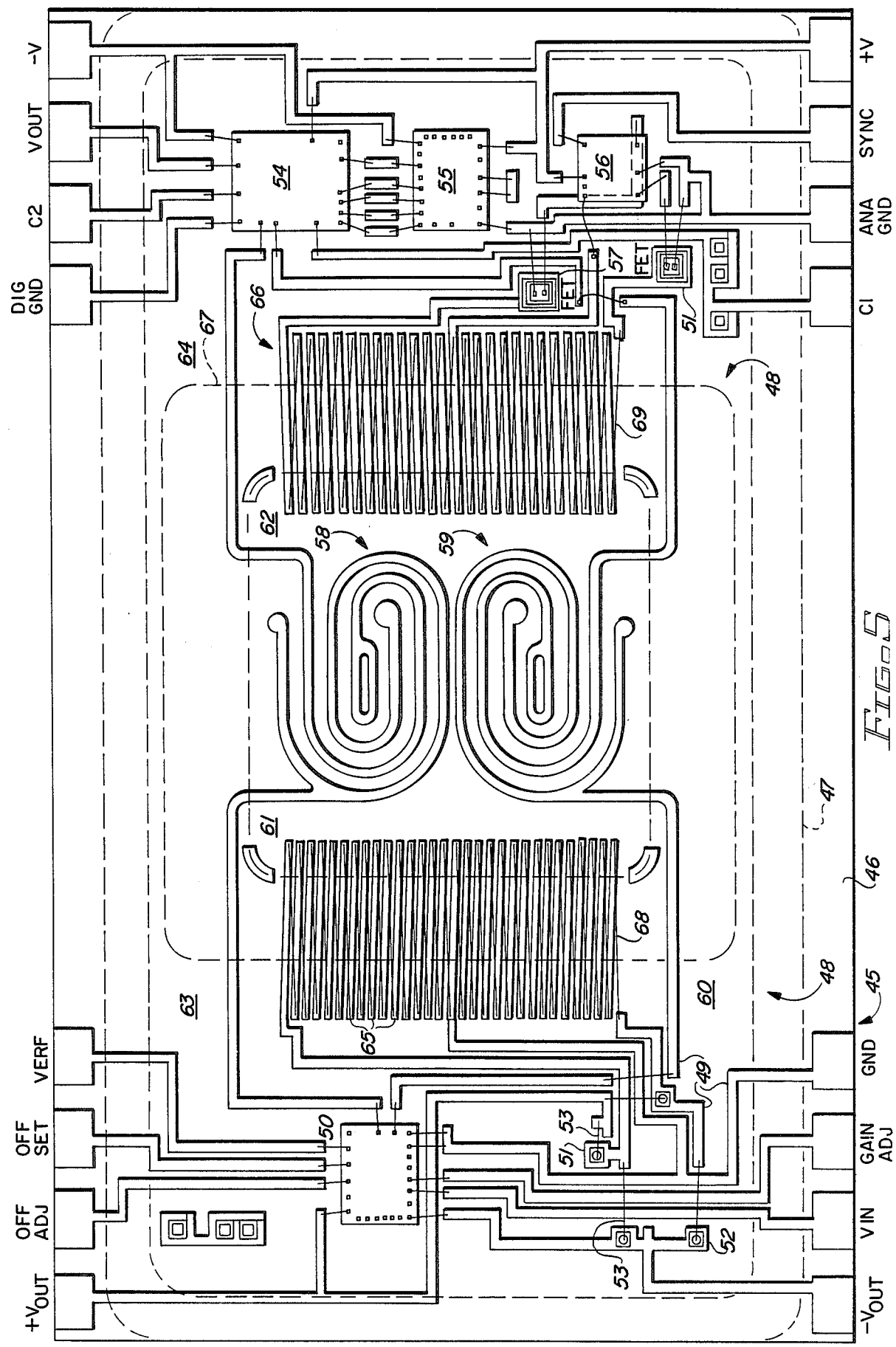
FIG. 5 is a detailed top view of the single cavity package of FIG. 4.

Referring now to FIGS. 4 and 5, another embodiment of the invention is shown wherein a single cavity is provided, in which both the input stage and output stage of the isolation amplifier circuitry are enclosed. This embodiment of the invention includes two isolation barrier circuits, the first including fringe capacitors 58 and 59, having structures essentially similar to those described above. That is, each is formed with one terminal extending into the region of the input stage of the isolation amplifier and another terminal extending into the region of the isolation amplifier output circuitry. In accordance with the present invention, small signals or AC signals are coupled between the input stage and the output stage of the isolation amplifier with a high degree of electrical isolation (at least 1500 volts) being maintained.

In FIGS. 4 and 5, the fringe capacitor structures 58 and 59 are formed within a square region surrounded by a square ferrite toroid 67. The square toroid 67 rests on a thin layer of glass passivation 60 that covers and fills the spaces between the spiral conductors forming fringe capacitors 58 and 59. The glass passivation 60 also covers a plurality of coplanar conductive strips 65 and 66 formed on a ceramic substrate 46, in accordance with the teachings of commonly assigned U.S. Pat. No. 4,103,267, issued July 25, 1978 (Olschewski). The coplanar conductive strips 65 form the bottom portions of the secondary windings of an isolation transformer including square toroid 67. The coplanar conductors 66 form the bottom portions of the primarY windings of that transformer. The metalization patterns shown are formed of gold, rather than tungsten, as the assembly is not cofired, as for the device of FIGS. 1 and 3. The various metalization patterns formed on the surface of ceramic substrate 46 can be generally as described above with reference to FIG. 1, although a number of field effect transistors 57 are provided for coupling DC signals to the primary winding. The secondaryy winding is formed of the coplanar strips 65 and a plurality of bonding wire loops 68 each of which is wire bonded so as to make connection to at least one of the conductors 65 and loop over the top of the square toroid 67. Most of the conductors 68 are connected to opposite ends of adjacent coplanar conductors 65. Wire bonding loops 69 similarly are wire bonded to opposite ends of adjacent coplanar conductors 66 to form a continuous primary winding about the opposite parallel leg of toroid 67.

Field effect transistors such as 57 are utilized to switch the primary winding of the resulting transformer in response to an oscillator 56. The voltage-to-frequency converter is described in detail in the copending Sommerville application, is designated by reference numerals 50 and 55, and the phase locked loop encoder circuit is described with reference numeral 54. A ceramic wall 47 is attached to the peripheral upper surface portions of substrate 46. A suitable ceramic (not shown) is epoxied to the upper edge of ceramic wall 47 to enclose the cavity.

As described in the Olschewski patent, which is incorporated herein by reference, the toroid 67 is adhesively attached to the top of the passivation overlying the center portions of the coplanar conductors 65 and 66. The toroid is coated with an insulative coating to prevent the bonding loops from being short circuited thereto.

Figure 7:
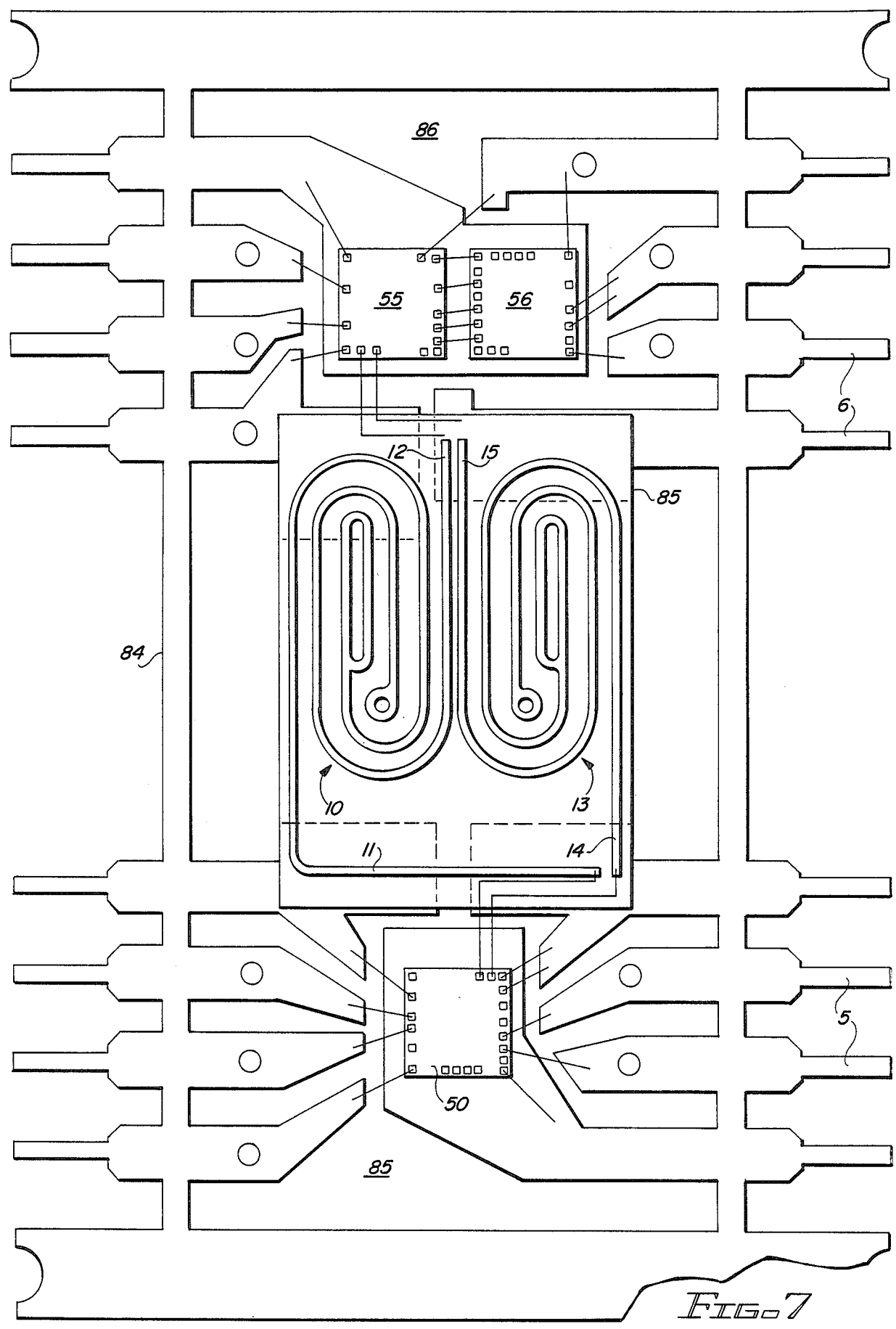
FIG. 7 is a plan view showing an alternate embodiment of the invention wherein a substrate supporting a pair of fringe capacitors is suspended between separate sections of the lead frame of an isolation amplifier.

FIG. 7 shows yet another embodiment of the invention, wherein a lead frame 84 is provided with two sections 85 and 86. A plurality of leads 5 extend into section 85. A plurality of leads 6 extend into section 86.

A premanufactured ceramic substrate 85 has 3 picofarad fringe capacitors 10 and 13 of the kind described above formed thereon by any suitable technique. A layer of passivation (not shown) covers fringe capacitors 10 and 13, except for the end portions forming terminals 11, 12, 14, and 15. Ceramic substrate 85 is adhesively attached to the inner members of each of sections 85 and 86, and thereby spans the open gap therebetween. Suitable isolation amplifier circuits, including voltage-to-frequency converter chips 50 and 56 and phase locked loop circuit 55, are die bonded on various of the metal members in regions 85 and 86. Suitable wire bonds are provided, as shown, including wire bonds between the various chips and the fringe capacitor terminals. All of the circuitry then is encapsulated in plastic by a suitable transfer molding operation, and the unused portions of the lead frame are removed. This embodiment of the invention provides a lower cost plastic encapsulated isolation amplifier. However, its isolation breakdown voltage is less than that of the earlier described embodiments of the invention.

While the invention has been described with reference to several particular embodiments thereof, those skilled in the art will be able to make various modifications to the described embodiments of the invention without departing from the true spirit and scope thereof. It is intended that packages that are equivalent to those described herein in that they perform substantially the same function in substantially the same way to achieve the same result are considered to be within the scope of the present invention. For example, other insulating substrate materials than those described herein could be utilized. Other refractory materials than tungsten can be used for the embodiments of FIGS. 1 and 3.

I claim:

1. In a hybrid integrated circuit, a planar capacitor comprising in combination:
    (a) first and second coplanar metal film conductors, the first and second metal film conductors each having a plurality of closely, precisely spaced parallel portion and together forming a planar first fringe capacitor;
    (b) dielectric material including (1) a first portion disposed directly on and entirely coating the parallel portions of the first and second metal film conductors and (2) a second portion bounding both a first cavity and a second cavity substantially spaced from the first cavity;
    (c) end portions of the first and second metal film conductors extending into the first and second cavity, respectively, to form first and second terminals of the first fringe capacitor, the second portion of the dielectric material being sufficiently thick that the first and second cavities are large enough to contain first and second integrated circuit chips, respectively, the first and second integrated circuit chips including first and second bonding pads, respectively, and a first conductor connecting the first bonding pad to the end portion of the first metal film conductor, and a second conductor connecting the second bonding pad to the end portion of the second metal film conductor, the separation between the first and second metal film conductors being sufficiently high that the first fringe capacitor forms a high voltage isolation barrier between the first and second integrated circuit chips, the spacing between the first and second cavities being great enough to provide a high voltage electrical isolation between the first and second integrated circuit chips.

2. In a hybrid integrated circuit, the planar capacitor of claim 1 wherein the dielectric layer includes a layer of thick film glass.

3. In a hybrid integrated circuit, the planar capacitor of claim 1 wherein the first and second metal film conductors are refractory metal, and the dielectric layer includes a ceramic layer confired with the ceramic substrate and the refractory metal to fill the space between the parallel portions of the first and second metal film conductors with ceramic.

4. In a hybrid integrated circuit, the planar capacitor of claim 1 wherein the parallel portions of the first and second metal film conductors, respectively, define a pair of spaced spiral traces, the ends of which are rounded to prevent electrical arcing.

5. In a hybrid integrated circuit, the planar capacitor of claim 4 wherein the first and second metal film conductors are approximately ten mils wide and wherein the spacing therebetween is greater than 20 mils to provide electrical isolation between the first and second terminals of at least 1500 volts.

6. A hybrid integrated circuit comprising in combination:
   (a) a ceramic substrate;
   (b) a first planar capacitor including first and second coplanar metal film conductors on the ceramic substrate each having a first portion closely and precisely spaced from and parallel to the other and having a predetermined capacitive coupling to the other;
   (c) a dielectric layer on the first parallel portions and on the substrate between the first parallel portions of the first and second metal film conductors, the dielectric layer including first and second openings exposing first and second areas, respectively, of the ceramic substrate and defining first and second cavities, respectively;
   (d) a first terminal of the first planar capacitor including an exposed portion of the first metal film conductor extending into the first cavity and a second terminal of the first planar capacitor including an exposed portion of the second metal film conductor extending into the second cavity, the first palnar capacitor forming a high voltage isolation barrier between the first and second terminals;
   (e) input integrated circuit chip means for producing a first pulse signal on the first terminal in response to an input signal, the first pulse signal being coupled across the isolation barrier to produce a second pulse signal to the second terminal; and
   (f) output integrated circuit chip means for producing an output signal in response to the second pulse signal on the second terminal, the dielectric layer being sufficiently thick that (1) the first cavity is deep enough to contain the input integrated circuit chip means and a bonding wire bonded at one end to a bonding pad on the input integrated circuit chip means and bonded at another end to the exposed portion of the first metal film conductor and (2) the second cavity is deep enough to contain the output integrated circuit chip means and a bonding wire bonded at one end to a bonding pad on the output integrated circuit chip means and bonded at another end to the exposed portion of the second metal film conductor.

7. The hybrid integrated circuit of claim 6 including a second planar capacitor including third and fourth coplanar metal film conductors on the ceramic substrate, each having a second portion closely and precisely spaced from and parallel to the other and having the predetermined capacitive coupling to the other, a third terminal of the second planar capacitor including an exposed portion of the third metal film conductor extending into the first cavity and a fourth terminal of the second planar capacitor including an exposed portion of the fourth metal film conductor extending into the second cavity, the second planar capacitor being included in the high voltage isolation barrier.

8. The hybrid integrated circuit of claim 7 wherein the input circuit means produces a third pulse signal on the third terminal in response to the input signal, the third pulse signal being coupled across the isolation barrier to produce a fourth pulse signal on the fourth terminal, the output circuit means producing the output signal in response to the fourth pulse signal on the fourth terminal.

9. The hybrid integrated circuit of claim 8 wherein the predetermined capacitive coupling is approximately three picofarads.

10. The hybrid integrated circuit of claim 8 wherein the first closely, precisely spaced parallel portion includes spiral portions of the first and second metal film conductors.

11. The hybrid integrated circuit of claim 10 wherein the end portions of the first and second metal film conductors are rounded to avoid electrical arcing.

12. The hybrid integrated circuit of claim 7 wherein the first and second cavities are disposed on opposite sides of the isolation barrier.

13. The hybrid integrated circuit of claim 8 wherein the dielectric layer includes a layer of thick film glass.

14. A hybrid integrated circuit package comprising in combination:
   (a) a ceramic substrate;
   (b) first and second coplanar metal film conductors on the substrate, the first and second metal film conductors each having a closely, precisely spaced parallel portion and forming a planar first fringe capacitor;
   (c) a dielectric layer on the parallel portions and on the substrate between the parallel portions;
   (d) first and second openings in the dielectric layer exposing first and second areas, respectively, of the substrate, the first and second openings defining first and second cavities, respectively; and
   (e) an end portion of the first metal film conductor extending into the first cavity, an end portion of the second metal film conductor extending into the second cavity, the dielectric layer being sufficiently thick that the first and second cavities each are deep enough to contain an integrated cirucit chip and a wire bond including a piece of bonding wire having one end bonded to a bonding pad on the integrated circuit chip and another end bonded to the metal film end portion in that cavity when a flat cover is placed on the dielectric layer over that cavity.

15. The hybrid integrated circuit package of claim 14 wherein the first and second cavities are approximately 40 mils deep.

16. The hybrid integrated circuit package of claim 14 wherein the capacitive coupling between the metal film conductors is approximately 3 picofarads and the spacing between them is greater than approximately 20 mils, to produce at least 1500 volts of electrical isolation between the end portions of the first and second metal film conductors extending into the first and second cavities, respectively.

17. A hybrid integrated circuit comprising in combination:
   (a) a ceramic substrate;
   (b) a first planar capacitor including first and second coplanar metal film conductors on the ceramic substrate each having a first portion closely and precisely spaced from and parallel to the other and having a predetermined capacitive coupling to the other;
   (c) a dielectric layer on the first parallel portions and on the substrate between the first parallel portions of the first and second metal film conductors;
   (d) a first terminal of the first planar capacitor including an exposed portion of the first metal film conductor extending beyond one side of the dielectric layer and a second terminal of the first planar capacitor including an exposed portion of the second metal film conductor extending beyond an opposite side of the dielectric layer, the first planar capacitor forming an isolation barrier between the first and second terminals;
   (e) input circuit means for producing a first pulse signal on the first terminal in response to an input signal, the first pulse signal being coupled across the isolation barrier to produce a second pulse signal on the second terminal;
   (f) output circuit means for producing an output signal in response to the second pulse signal on the second terminal; and
   (g) a toroidal transformer disposed on the dielectric layer and having a primary winding coupled to the output circuit and a secondary winding coupled to the input circuit, wherein the primary winding includes a plurality of elongated strips of thin film metal on the ceramic substrate adjacent to the output circuit means and a plurality of wire bond loops each wire bonded to and looping from one end of one of the elongated thin film metal stripes over an adjacent portion of the toroidal transformer to the opposite end of an adjacent thin film metal stripe and wire bonded thereto to form the primary winding of the toroidal transformer, and also includes a plurality of elongated thin film metal film stripes adjacent to the input circuit means, a plurality of wire bond loops each wire bonded to and looping from one end of one of those metal film stripes over an adjacent portion of the toroidal transformer to the opposite end of an adjacent thin film metal stripe and wire bonded thereto to form the secondary winding of the toroidal transformer, wherein the first capacitor is located beneath the region bounded by the toroidal core.

18. The hybrid transformer of claim 17 wherein the toroidal transformer is a square toroidal transformer.

19. The hybrid integrated circuit of claim 17 wherein the ceramic substrate is suspended between first and second lead frame members, and wherein the input circuit means and output circuit means are disposed on lead frame members on opposite sides of the ceramic substrate.

* * * * *